(12) United States Patent
Nakamura et al.

(10) Patent No.: US 7,329,564 B2
(45) Date of Patent: Feb. 12, 2008

(54) WAFER DIVIDING METHOD

(75) Inventors: Masaru Nakamura, Tokyo (JP); Yusuke Nagai, Tokyo (JP); Kentaro Iizuka, Tokyo (JP)

(73) Assignee: Disco Corporation, Tokyo (JP)

( * ) Notice: Subject to any disclaimer, the term of this patent is extended or adjusted under 35 U.S.C. 154(b) by 351 days.

(21) Appl. No.: 11/198,137

(22) Filed: Aug. 8, 2005

(65) Prior Publication Data

US 2006/0035444 A1 Feb. 16, 2006

(30) Foreign Application Priority Data

Aug. 10, 2004 (JP) .............................. 2004-233316

(51) Int. Cl.
*H01L 21/00* (2006.01)
*H01L 21/30* (2006.01)
*H01L 21/46* (2006.01)

(52) U.S. Cl. ...................... 438/113; 438/458; 438/462; 438/463; 438/464; 257/E21.599

(58) Field of Classification Search ..................... None
See application file for complete search history.

(56) References Cited

U.S. PATENT DOCUMENTS 5,981,361 A * 11/1999 Yamada ...................... 438/464
6,297,075 B1 * 10/2001 Odajima et al. ............. 438/110
6,401,317 B1 * 6/2002 Yamada ....................... 29/33 M
6,544,819 B2 * 4/2003 Odajima et al. ............. 438/118
7,232,741 B2 * 6/2007 Nagai et al. ................. 438/460
2001/0018229 A1 * 8/2001 Kato et al. ................... 438/106
2002/0048905 A1 * 4/2002 Ikegami et al. ............. 438/464
2005/0090077 A1 4/2005 Nagai et al.
2006/0035444 A1 * 2/2006 Nakamura et al. .......... 438/464

FOREIGN PATENT DOCUMENTS

JP 3408805 3/2003
JP 2005-129607 5/2005

* cited by examiner

*Primary Examiner*—David E Graybill
(74) *Attorney, Agent, or Firm*—Smith, Gambrell & Russell, LLP

(57) ABSTRACT

A method of dividing a wafer having a plurality of dividing lines formed on the front surface in a lattice pattern and function elements formed in a plurality of areas sectioned by the plurality of dividing lines into individual chips, along the dividing lines, the method comprising the steps of forming a deteriorated layer by applying a laser beam capable of passing through the wafer along the dividing lines; expanding the support tape affixed to the wafer to divide the wafer into individual chips along the dividing lines where the deteriorated layer has been formed and to form a space between adjacent chips; and applying an external stimulus to an area, to which the wafer is affixed, of the support tape in the above state to cure the adhesive layer to maintain the space between adjacent chips.

4 Claims, 8 Drawing Sheets (a)

(b)

(a)

(b)

WAFER DIVIDING METHOD

FIELD OF THE INVENTION

The present invention relates to a method of dividing a wafer having a plurality of dividing lines, which are formed on the front surface in a lattice pattern and function elements formed in a plurality of areas sectioned by the plurality of dividing lines into individual chips along dividing lines.

DESCRIPTION OF THE PRIOR ART

In the production process of a semiconductor device, a plurality of areas are sectioned by dividing lines, which are called "streets", arranged in a lattice pattern on the front surface of a substantially disk-like semiconductor wafer, and a circuit such as IC, LSI or the like is formed in each of the sectioned areas. Individual semiconductor chips are manufactured by cutting this semiconductor wafer along the dividing lines, to divide it into the areas having a circuit formed thereon. An optical device wafer comprising gallium nitride-based compound semiconductors laminated on the front surface of a sapphire substrate is also cut along predetermined dividing lines, to be divided into individual optical devices such as light emitting diodes or laser diodes, which are widely used in electric appliances.

Cutting along the dividing lines, of the above semiconductor wafer or optical device wafer is generally carried out by using a cutting machine called "dicer". This cutting machine has a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the spindle and a drive mechanism for rotary-driving the rotary spindle. The cutting blade comprises a disk-like base and an annular cutting edge which is mounted on the side wall peripheral portion of the base and formed to have a thickness of about 20 µm by fixing diamond abrasive grains having a diameter of about 3 µm to the base by electroforming.

Since a sapphire substrate, silicon carbide substrate, etc. have high Mohs hardness, however, cutting with the above cutting blade is not always easy. Further, as the cutting blade has a thickness of about 20 µm, the dividing lines for sectioning devices must have a width of about 50 µm. Therefore, in the case of a device measuring 300 µm×300 µm, the area ratio of the streets to the wafer becomes 14%, thereby reducing productivity.

Meanwhile, as a means of dividing a plate-like workpiece such as a semiconductor wafer, a laser processing method for applying a pulse laser beam capable of passing through the workpiece with its focusing point set to the inside of the area to be divided is also attempted nowadays. In the dividing method making use of this laser processing technique, the workpiece is divided by applying a pulse laser beam at an infrared range capable of passing through the workpiece from one surface side of the workpiece with its focusing point set to the inside to continuously form a deteriorated layer in the inside of the workpiece along the dividing lines and exerting external force along the dividing lines whose strength has been reduced by the formation of the deteriorated layers. This method is disclosed by Japanese Patent No. 3408805, for example.

To divide a wafer having deteriorated layers formed continuously along the dividing lines into individual chips by exerting external force along the dividing lines of the wafer, the applicant of this application has proposed technology for dividing a wafer into individual chips along dividing lines, where a deteriorated layer has been formed, by expanding a support tape affixed to the wafer to give tensile force to the wafer as JP-A 2003-361471.

In the method for dividing the wafer into individual chips by expanding the support tape affixed to the wafer whose strength has been reduced along the dividing lines to give tensile force to the wafer, when tensile force is released after the wafer is divided into individual chips by expanding the support tape, the expanded support tape shrinks and consequently, the obtained chips come into contact with one another during transportation, thereby damaging the chips.

SUMMARY OF THE INVENTION

It is an object of the present invention to provide a wafer dividing method capable of forming and maintaining a predetermined space between adjacent individual chips by expanding a support tape affixed to a wafer whose strength has been reduced along dividing lines to give tensile force to the wafer.

According to the present invention, firstly, the above object of the present invention is attained by a method of dividing a wafer having a plurality of dividing lines formed on the front surface in a lattice pattern and function elements formed in a plurality of areas sectioned by the plurality of dividing lines into individual chips, along the dividing lines, the method comprising:

a deteriorated layer forming step for applying a laser beam capable of passing through the wafer along the dividing lines to form a deteriorated layer along the dividing lines in the inside of the wafer;

a wafer supporting step for putting the wafer after the deteriorated layer forming step on a support tape having an adhesive layer, which is mounted on an annular frame and is cured by an external stimulus;

a tape expanding step for expanding the support tape affixed to the wafer to divide the wafer into individual chips along the dividing lines where the deteriorated layer has been formed and to form a space between adjacent chips; and a chip spacing maintaining step for giving an external stimulus to an area, to which the wafer of the support tape is affixed, in a state where the space is formed between adjacent chips in the tape expanding step, to cure the adhesive layer and to maintain the space between adjacent chips.

According to the present invention, secondly, the above object of the present invention can be attained by a method of dividing a wafer having a plurality of dividing lines formed on the front surface in a lattice pattern and function elements formed in a plurality of areas sectioned by the plurality of dividing lines into individual chips, along the dividing lines, the method comprising:

a wafer supporting step for putting the wafer on a support tape having an adhesive layer that is mounted on an annular frame and is cured by an external stimulus;

a deteriorated layer forming step for applying a laser beam capable of passing through the wafer put on the support tape mounted on the annular frame, along the dividing lines to form a deteriorated layer along the dividing lines in the inside of the wafer;

a tape expanding step for expanding the support tape affixed to the wafer to divide the wafer into individual chips along the dividing lines where the deteriorated layer has been formed and to form a space between adjacent chips; and a chip spacing maintaining step for giving an external stimulus to the wafer, to which the wafer of the support tape is affixed, in a state where the space is formed between adjacent chips in the tape expanding step, to cure the adhesive layer to maintain the space between adjacent chips.

Preferably, the above support tape is formed from a synthetic resin sheet which shrinks by heat at a temperature higher than a predetermined temperature, and a tape shrinking step for shrinking an area existing between the inner periphery of the annular frame and the wafer in the support tape mounted on the annular frame by heating is carried out after the chip spacing maintaining step.

Since the step of maintaining the space between adjacent chips by giving an external stimulus to the area to which the wafer of the support tape is affixed in a state where the space is formed between adjacent chips in the tape expanding step, to cure the adhesive layer of the support tape in the wafer dividing method of the present invention, the obtained individually divided chips do not come into contact with one another, thereby making it possible to prevent a damage to the chips by contact during transportation.

DETAILED DESCRIPTION OF THE PREFERRED EMBODIMENTS

Preferred embodiments of the wafer dividing method of the present invention will be described in more detail hereinunder with reference to the accompanying drawings.

Figure 1:
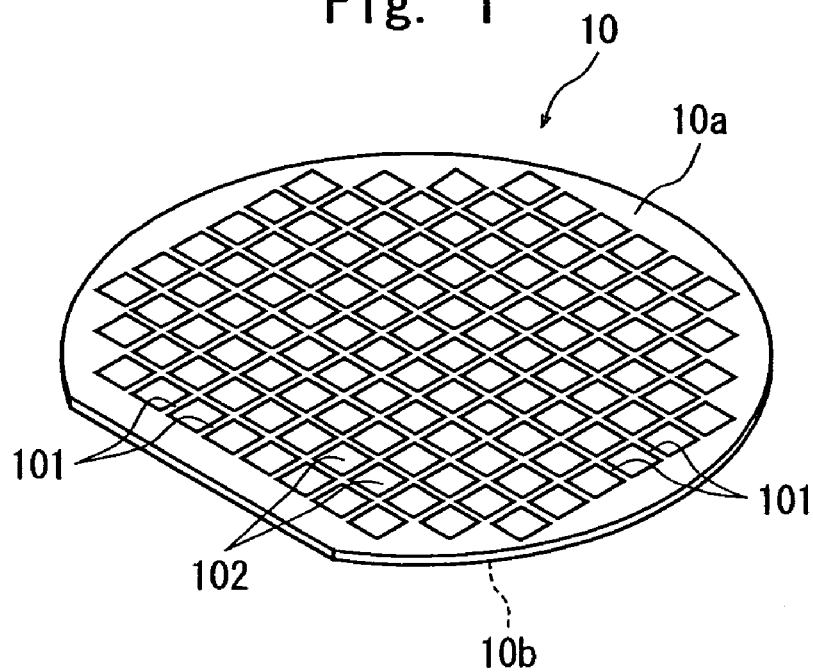
FIG. 1 is a perspective view of a semiconductor wafer to be divided into individual chips by the wafer dividing method of the present invention.

FIG. 1 is a perspective view of a semiconductor wafer as a wafer to be divided into individual chips according to the present invention. The semiconductor wafer 10 shown in FIG. 1 is, for example, a silicon wafer having a thickness of 300 μm, and a plurality of dividing lines 101 are formed on the front surface 10a in a lattice pattern. Circuits 102 as function elements are formed on the front surface 10a of the semiconductor wafer 10 in a plurality of areas sectioned by the plurality of dividing lines 101. An embodiment of the method of dividing this semiconductor wafer 10 into individual semiconductor chips will be described hereinunder.

To divide the semiconductor wafer 10 into individual semiconductor chips, a step of forming a deteriorated layer in the inside of the semiconductor wafer 10 along the dividing lines 101 by applying a pulse laser beam capable of passing through the semiconductor wafer 10 along the dividing lines 101 so as to reduce the strength of the semiconductor wafer 10 along the dividing lines 101 is carried out. This deteriorated layer forming step is carried out by using a laser beam processing machine 1 shown in FIGS. 2 to 4. The laser beam processing machine 1 shown in FIGS. 2 to 4 comprises a chuck table 11 for holding a workpiece, a laser beam application means 12 for applying a laser beam to the workpiece held on the chuck table 11, and an image pick-up means 13 for picking up an image of the workpiece held on the chuck table 11. The chuck table 11 is so constituted as to suction-hold the workpiece and is designed to be moved in a processing-feed direction indicated by an arrow X and an indexing-feed direction indicated by an arrow Y in FIG. 2 by a moving mechanism that is not shown.

Figure 3:
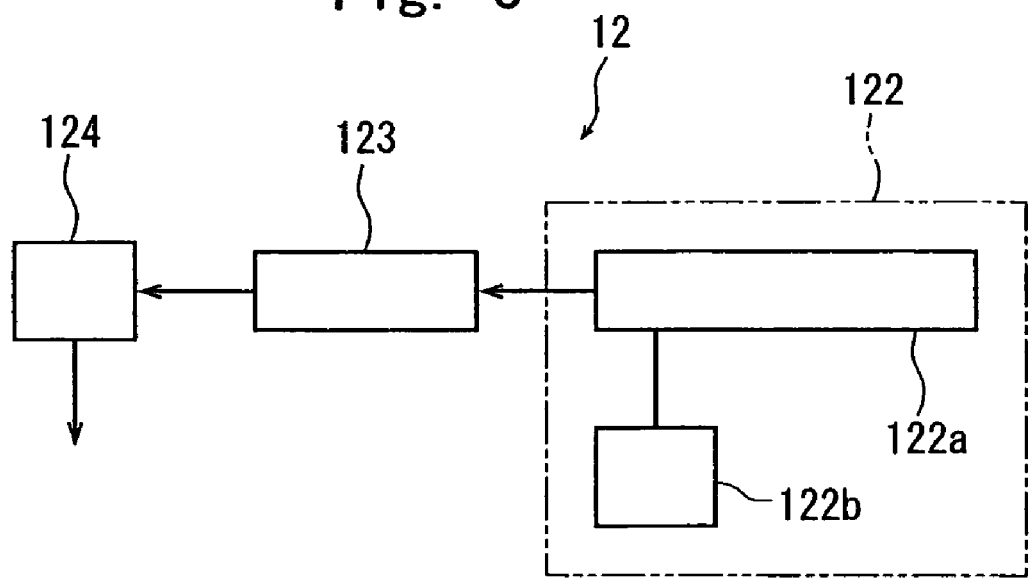
FIG. 3 is a block diagram schematically showing the constitution of laser beam application means provided in the laser beam processing machine shown in FIG. 2.
Figure 4:
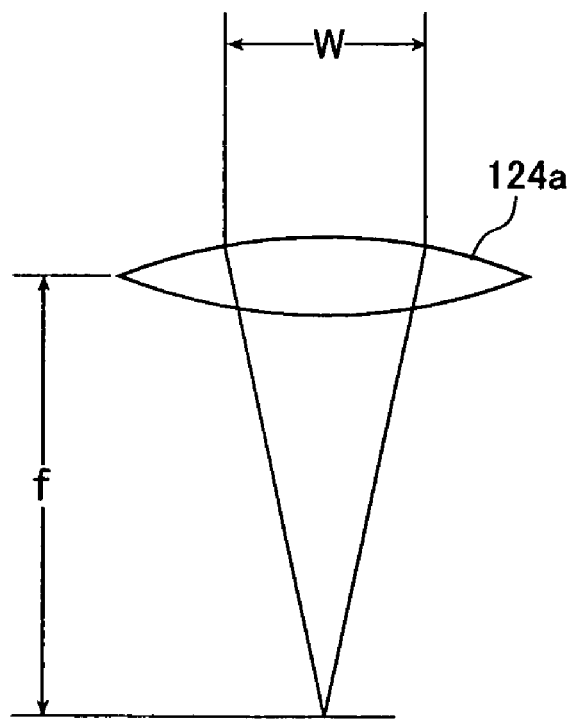
FIG. 4 is a schematic diagram for explaining the focusing spot diameter of a pulse laser beam.

The above laser beam application means 12 has a cylindrical casing 121 arranged substantially horizontally. In the casing 121, as shown in FIG. 3, there are installed pulse laser beam oscillation means 122 and a transmission optical system 123. The pulse laser beam oscillation means 122 comprises a pulse laser beam oscillator 122a composed of a YAG laser oscillator or YVO4 laser oscillator and a repetition frequency setting means 122b connected to the pulse laser beam oscillator 122a. The transmission optical system 123 comprises suitable optical elements such as a beam splitter, etc. A condenser 124 housing condensing lenses (not shown) constituted by a set of lenses that may be formation known per se is attached to the end of the above casing 121. A laser beam oscillated from the above pulse laser beam oscillation means 122 reaches the condenser 124 through the transmission optical system 123 and is applied from the condenser 124 to the workpiece held on the above chuck table 11 at a predetermined focusing spot diameter D. This focusing spot diameter D is defined by the expression D (μm)=4×λ×f/(π×W) (wherein λ is the wavelength (μm) of the pulse laser beam, W is the diameter (mm) of the pulse laser beam applied to an objective lens 124a, and f is the focusing distance (mm) of the objective lens 124a) when the pulse laser beam showing a Gaussian distribution is applied through the objective lens 124a of the condenser 124 as shown in FIG. 4.

The image pick-up means 13 attached to the end of the casing 121 constituting the above laser beam application means 12 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

The deteriorated layer forming step which is carried out by using the above laser beam processing machine 1 will be described with reference to FIG. 2, FIGS. 5(a) and 5(b) and FIG. 6.

Figure 2:
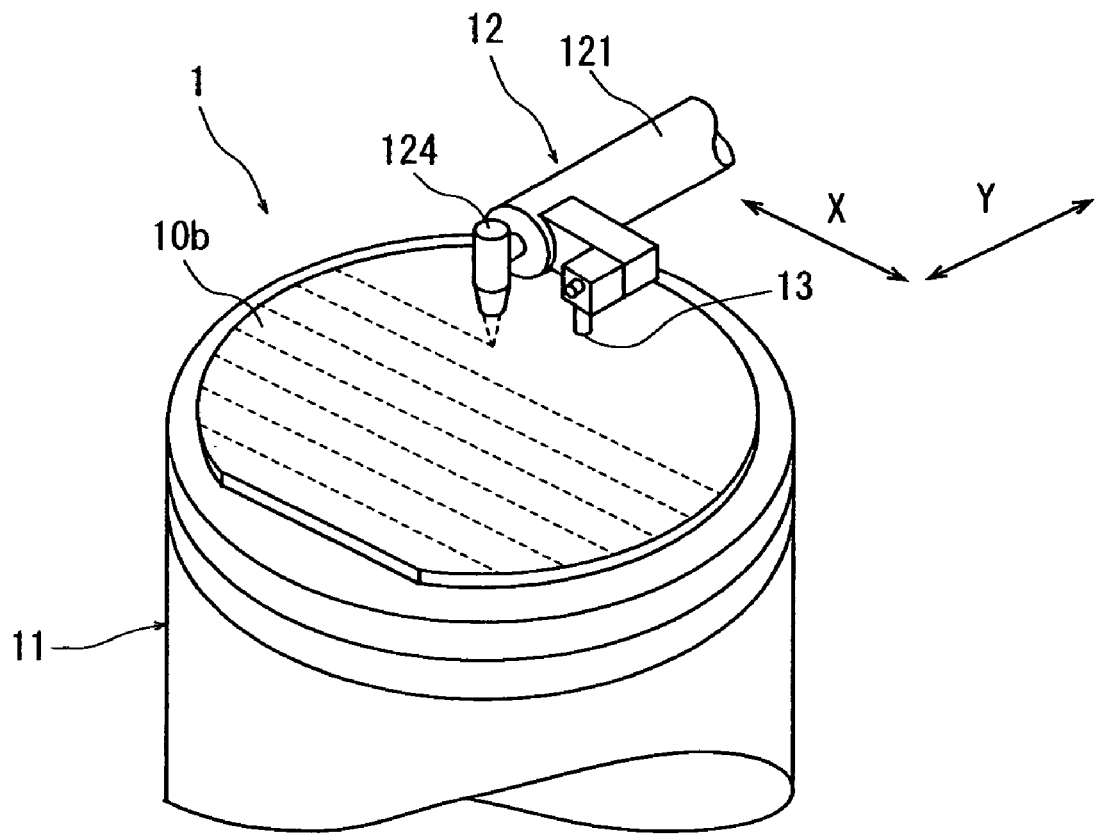
FIG. 2 is a perspective view of the principal section of a laser beam processing machine for carrying out the deteriorated layer forming step in the wafer dividing method of the present invention.

In this deteriorated layer forming step, the semiconductor wafer 10 is first placed on the chuck table 11 of the laser beam processing machine 1 shown in FIG. 2 in such a manner that the back surface 10b faces up and suction-held on the chuck table 11. The chuck table 11 suction-holding the semiconductor wafer 10 is positioned right below the image pick-up means 13 by a moving mechanism that is not shown.

After the chuck table 11 is positioned right below the image pick-up means 13, alignment work for detecting the area to be processed of the semiconductor wafer 10 is carried out by using the image pick-up means 13 and the control means that is not shown. That is, the image pick-up means 13 and the control means (not shown) carry out image processing such as pattern matching, etc. to align a dividing line 101 formed in a predetermined direction of the semiconductor wafer 10 with the condenser 124 of the laser beam application means 12 for applying a laser beam along the dividing line 101, thereby performing the alignment of a laser beam application position. The alignment of the laser beam application position is also carried out on dividing lines 101 formed on the semiconductor wafer 10 in a direction perpendicular to the predetermined direction. Although the front surface 10a having the dividing lines 101 formed thereon of the semiconductor wafer 10 faces down at this point, as the image pick-up means 13 comprises infrared illuminating means, an optical system for capturing infrared radiation and an image pick-up device (infrared CCD) for outputting an electric signal corresponding to the infrared radiation as described above, an image of the dividing line 101 can be picked up through the back surface 10b.

Figure 5:
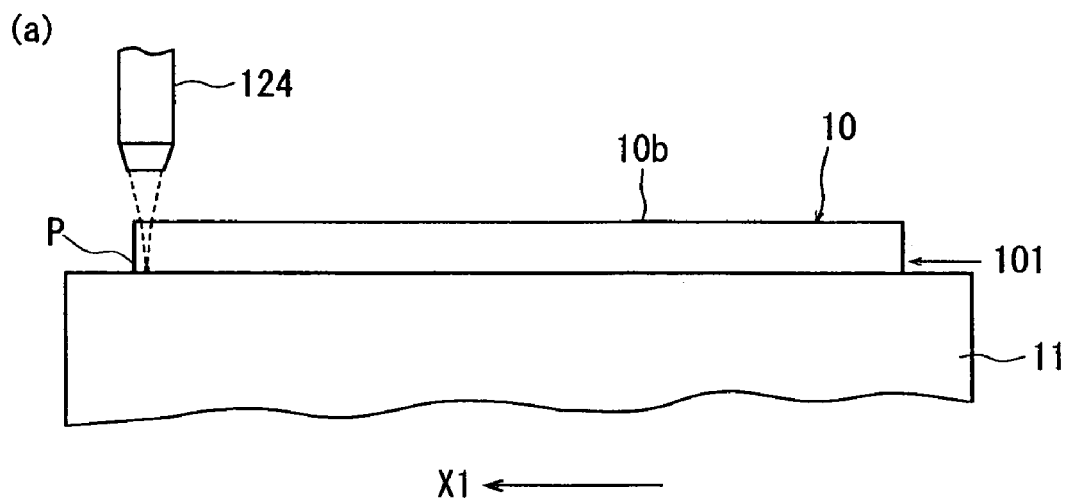
FIGS. 5(a) and 5(b) are explanatory diagrams showing the deteriorated layer forming step in the wafer dividing method of the present invention.

After the dividing line 101 formed on the semiconductor wafer 10 held on the chuck table 11 is detected and the alignment of the laser beam application position is carried out as described above, the chuck table 11 is moved to a laser beam application area where the condenser 124 of the laser beam application means 12 for applying a laser beam is located to bring one end (left end in FIG. 5(a)) of the predetermined dividing line 101 to a position right below the condenser 124 of the laser beam application means 12, as shown in FIG. 5(a). The chuck table 11, that is, the semiconductor wafer 10 is then moved in the direction indicated by the arrow X1 in FIG. 5(a) at a predetermined processing-feed rate while the pulse laser beam capable of passing through the semiconductor wafer 10 is applied from the condenser 124. When the application position of the condenser 124 of the laser beam application means 12 reaches the other end (right end in FIG. 5(b)) of the dividing line 101 as shown in FIG. 5(b), the application of the pulse laser beam is suspended and the movement of the chuck table 11, that is, the semiconductor wafer 10 is stopped. In this deteriorated layer forming step, the focusing point P of the pulse laser beam is set to a position near the front surface 10a (undersurface) of the semiconductor wafer 10. As a result, a deteriorated layer 110 is exposed to the front surface 10a (undersurface) and formed toward the inside from the front surface 10a. This deteriorated layer 110 is formed as a molten-resolidified layer, of which the wafer has been once molten and then re-solidified.

The processing conditions in the above deteriorated layer forming step are set as follows, for example.

Figure 6:
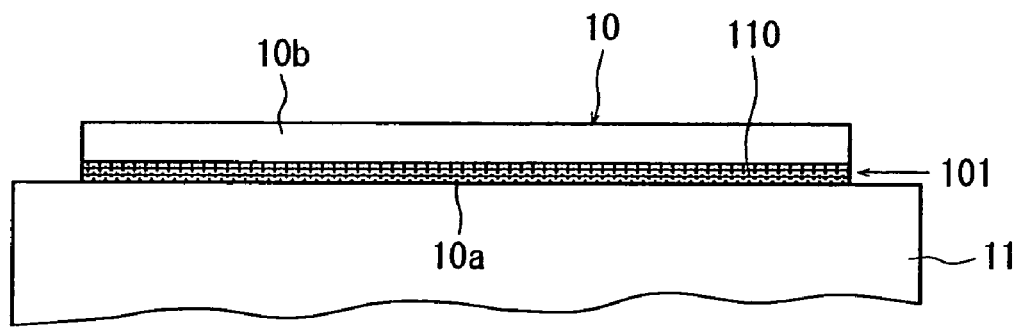
FIG. 6 is an explanatory diagram showing that a laminate of deteriorated layers are formed in the inside of the wafer in the deteriorated layer forming step shown in FIGS. 5(a) and 5(b)

Light source: LD excited Q switch Nd:YVO4 laser
Wavelength: pulse laser beam having a wavelength of 1,064 nm
Pulse output: 10 µJ
Focusing spot diameter: 1 µm
Peak power density of focusing point: $3.2 \times 10^{10}$ W/cm$^2$
Repetition frequency: 100 kHz
Processing-feed rate: 100 mm/sec When the semiconductor wafer 10 is thick, as shown in FIG. 6, the above-described deteriorated layer forming step is carried out several times by changing the focusing point P stepwise so as to form a plurality of deteriorated layers 110. For example, as the thickness of the deteriorated layer formed once under the above processing conditions is about 50 µm, the above deteriorated layer forming step is carried out three times to form deteriorated layers 110 having a total thickness of 150 µm. In the case of a wafer 10 having a thickness of 300 µm, six deteriorated layers 110 may be formed from the front surface 10a to the back surface 10b along the dividing lines 101 in the inside of the semiconductor wafer 10.

Figure 7:
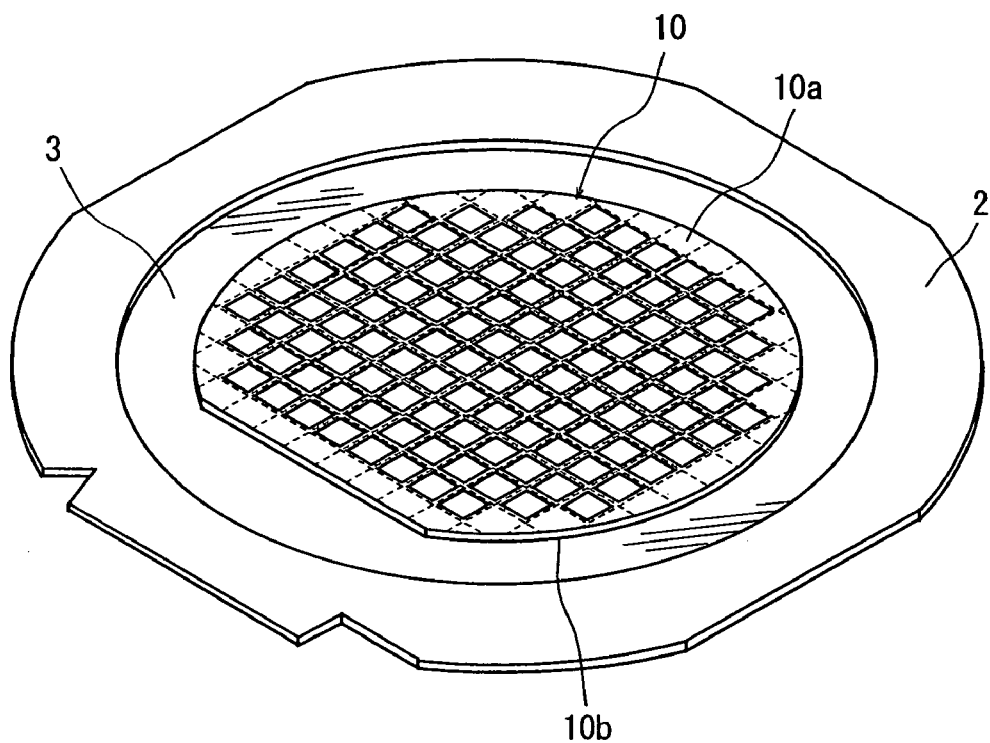
FIG. 7 is a perspective view showing a state where a semiconductor wafer, which has been subjected to the deteriorated layer forming step, is put on the surface of a support tape mounted on an annular frame.

After the deteriorated layer 110 is formed in the inside of the semiconductor wafer 10 along all the dividing lines 101 in the above-described deteriorated layer forming step, a step of putting one side of the wafer on the surface of a support tape 3 having an adhesive layer which is mounted on an annular frame and is cured by an external stimulus is carried out. That is, as shown in FIG. 7, the back surface 10b of the semiconductor wafer 10 is put on the surface of the support tape 3 whose peripheral portion is mounted on the annular frame 2 so as to cover its inner opening. The above support tape 3 is prepared by coating an about 5 µm-thick acrylic resin-based adhesive layer which is cured by an external stimulus such as ultraviolet radiation or the like, on the surface of a 70 µm-thick sheet backing formed of polyvinyl chloride (PVC) in the illustrated embodiment. The sheet backing for the support tape 3 is desirably a sheet of a synthetic resin such as polyvinyl chloride (PVC), polypropylene, polyethylene or polyolefin which is elasticity at normal temperature and shrinks by heat at a temperature higher than a predetermined temperature (for example, 70°). When the support tape 3 is affixed to the back surface 10b of the semiconductor wafer with an adhesive film for bonding, the adhesive film can be divided correspondingly to semiconductor chips in the tape expanding step that will be described later.

After the above wafer supporting step, next comes a step of expanding the support tape 3 affixed to the semiconductor wafer 10 to divide the semiconductor wafer 10 into individual semiconductor chips along the dividing lines 101 where the deteriorated layer 110 has been formed, and forming a space between adjacent chips. This tape expanding step is carried out by using a tape expanding apparatus 4 shown in FIG. 8 and FIG. 9.

Figure 8:
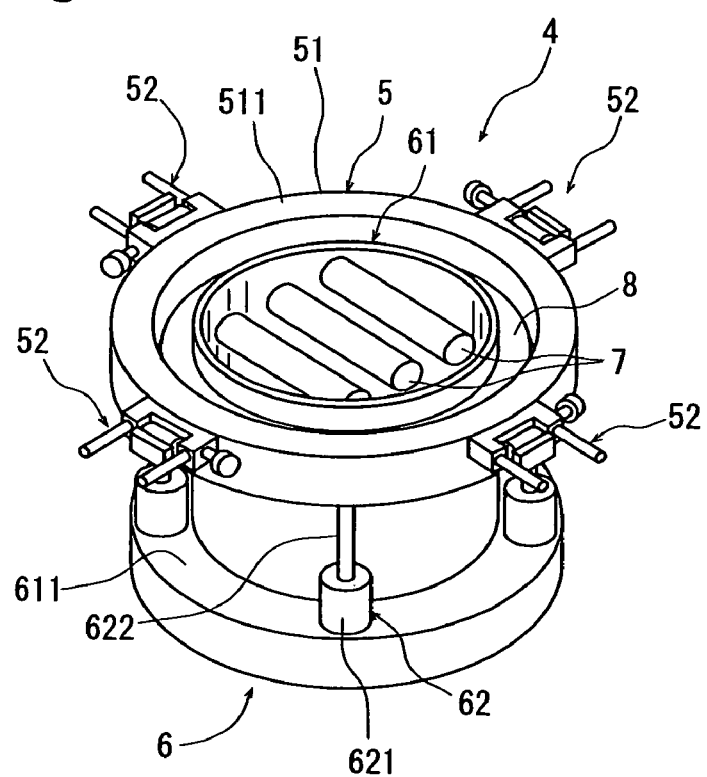
FIG. 8 is a perspective view of a tape expanding apparatus for carrying out the tape expansion step in the wafer dividing method of the present invention.
Figure 9:
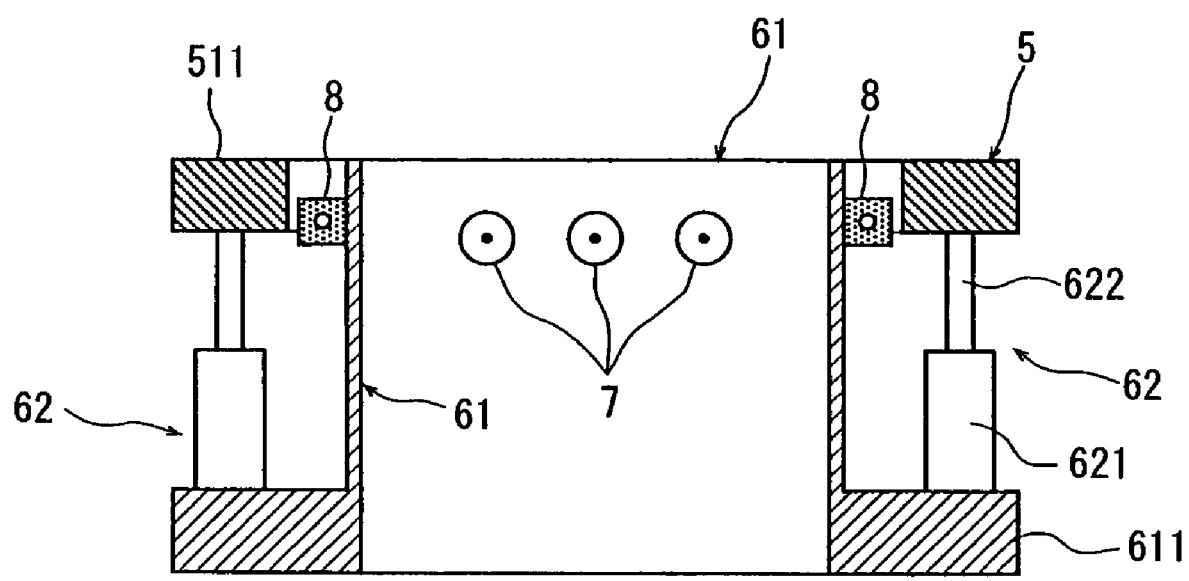
FIG. 9 is a sectional view of the tape expanding apparatus shown in FIG. 8.

FIG. 8 is a perspective view of the tape expanding apparatus 4 and FIG. 9 is a sectional view of the tape expanding apparatus 4 shown in FIG. 8. The tape expanding apparatus 4 in the illustrated embodiment has a frame holding means 5 for holding the above annular frame 2 and a tension application means 6 for expanding the support tape 3 mounted on the above annular frame. The frame holding means 5 comprises an annular frame holding member 51 and four clamps 52 as a fixing means arranged around the frame holding member 51, as shown in FIG. 8 and FIG. 9. The top surface of the frame holding member 51 forms a placing surface 511 for placing the annular frame 2, and the annular frame 2 is placed on this placing surface 511. The annular frame 2 placed on the placing surface 511 of the frame holding member 51 is fixed on the frame holding member 51 by the clamps 52.

The above tension application means 6 comprises an expansion drum 61 arranged within the above annular frame holding member 51. This expansion drum 61 has a smaller inner diameter than the inner diameter of the annular frame 2 and a larger outer diameter than the outer diameter of the semiconductor wafer 10 put on the support tape 3 mounted on the annular frame 2. The expansion drum 61 has a support flange 611 at the lower end. The tension application means 6 in the illustrated embodiment comprises support means 62 capable of moving the above annular frame holding member 51 in the vertical direction (axial direction). This support means 63 comprises a plurality (4 in the illustrated embodiment) of air cylinders 621 installed on the above support flange 611, and their piston rods 622 are connected to the undersurface of the above annular frame holding member 51. The support means 62 thus comprising the plurality of air cylinders 621 moves the annular frame holding member 51 in the up-and-down direction between a standard position where the placing surface 511 becomes substantially the same in height as the upper end of the expansion drum 61 and an expansion position where the placing surface 511 is positioned below the upper end of the expansion drum 61 by a predetermined distance.

The illustrated tape expansion apparatus 4 has ultraviolet irradiation lamps 7 arranged within the above expansion drum 61 as shown in FIG. 9. The ultraviolet irradiation lamps 7 apply ultraviolet radiation as an external stimulus to an area, to which the semiconductor wafer 10 is affixed, of the support tape 3 mounted on the annular frame 2 held on the above frame holding means 5. The tape expansion apparatus 4 has an annular infrared heater 8 as a heating means mounted on the outer periphery of the upper portion of the above expansion drum 61. This infrared heater 8 heats the area existing between the inner periphery of the annular frame 2 and the semiconductor wafer 10 of the support tape 3 mounted on the annular frame 2 held on the above frame holding means 5.

Figure 10:
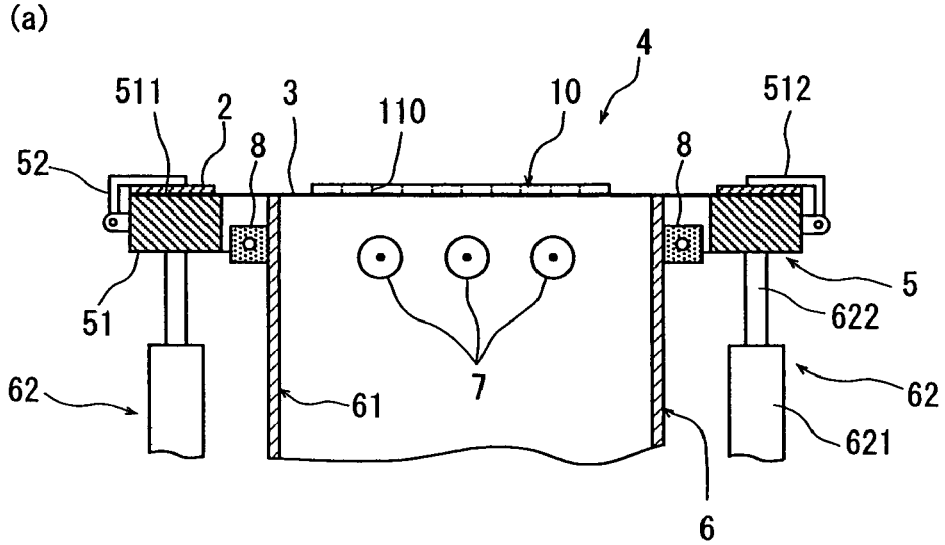
FIGS. 10(a) and 10(b) are explanatory diagrams showing the tape expanding step in the wafer dividing method of the present invention.
Figure 10:
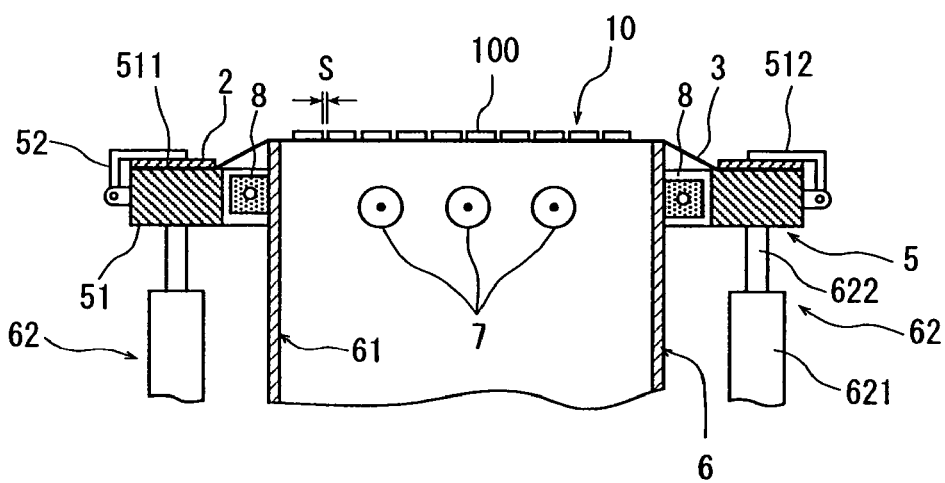

The tape expansion step which is carried out by using the thus constituted tape expansion apparatus 4 will be described with reference to FIGS. 10(a) and 10(b). That is, the annular frame 2 supporting the semiconductor wafer 10 (in which the deteriorated layer 110 is formed along the dividing lines 101) through the support tape 3 as shown in FIG. 7 is placed on the placing surface 511 of the frame holding member 51 constituting the frame holding means 5 and fixed on the frame holding member 51 by the clamps 52, as shown in FIG. 10(a). At this point, the frame holding member 51 is situated at the standard position shown in FIG. 10(a).

Thereafter, the annular frame holding member 51 is lowered to the expansion position shown in FIG. 10(b) by activating the plurality of air cylinders 621 as the support means 62 constituting the tension application means 6. Accordingly, the annular frame 2 fixed on the placing surface 511 of the frame holding member 51 is also lowered, whereby the support tape 3 mounting on the annular frame 2 comes into contact with the upper edge of the expansion drum 61 to be expanded, as shown in FIG. 10(b). As a result, tensile force acts radially on the semiconductor wafer 10 put on the support tape 3, thereby dividing the semiconductor wafer 10 into individual semiconductor chips 100 along the dividing lines 101 whose strength has been reduced by the formation of the deteriorated layers 110. Since the support tape 3 is expanded in this tape expanding step as described above, when the semiconductor wafer 10 is divided into individual semiconductor chips 100, a space S is formed between adjacent chips. The expansion or elongation amount of the support tape 3 in the above tape expanding step can be adjusted by the downward movement of the frame holding member 51. According to experiments conducted by the inventors of the present invention, when the support tape 3 was stretched about 20 mm, the semiconductor wafer 10 could be divided along the dividing lines 101 where the deteriorated layer 110 has been formed. The space S between adjacent semiconductor chips 100 was about 1 mm.

Figure 11:
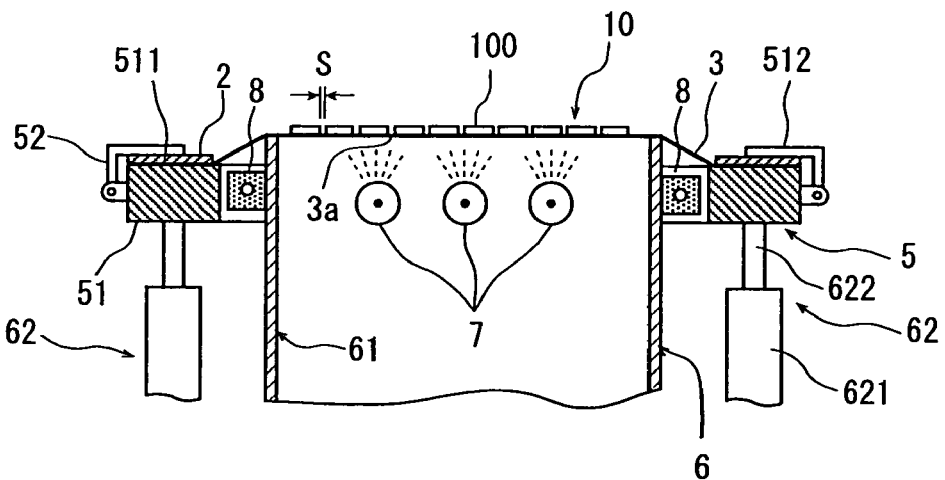
FIG. 11 is an explanatory diagram showing the chip spacing maintaining step in the wafer dividing method of the present invention.

After the above-described tape expanding step, next comes a step of maintaining the space S between adjacent chips by applying an external stimulus to the area, to which the semiconductor wafer 10 is affixed, of the support tape 3 and curing the adhesive layer formed on the support tape 3 in a state where the space S is formed between adjacent chips as described above. This chip spacing maintaining step is carried out in the state shown in FIG. 10(b) after the above tape expanding step. That is, as shown in FIG. 11, after the tape expanding step, the ultraviolet irradiation lamps 7 are turned on to apply ultraviolet radiation to an area 3a, to which the semiconductor wafer 10 is affixed, of the support tape 3. As a result, the adhesive layer formed on the support tape 3 is cured to maintain the spaces S between adjacent chips of semiconductor chips 100. Therefore, the semiconductor chips 100 do not come into contact with one another, thereby making it possible to prevent a damage to the semiconductor chips 100 caused by contact between the semiconductor chips 100 during transportation.

Figure 12:
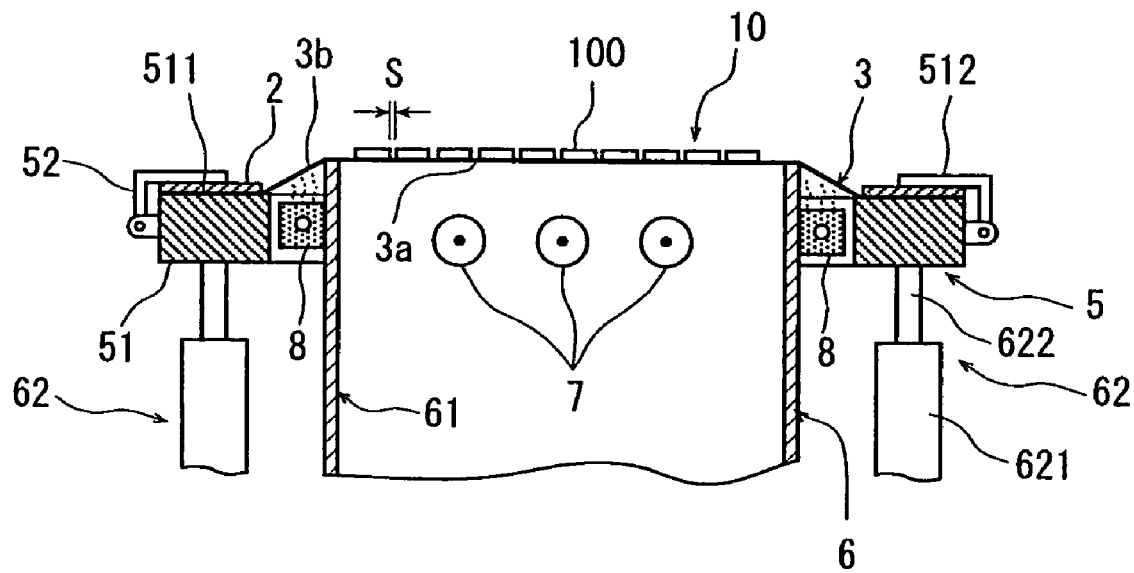
FIGS. 12(a) and 12(b) are explanatory diagrams showing the tape shrinking step in the wafer dividing method of the present invention.
Figure 12:
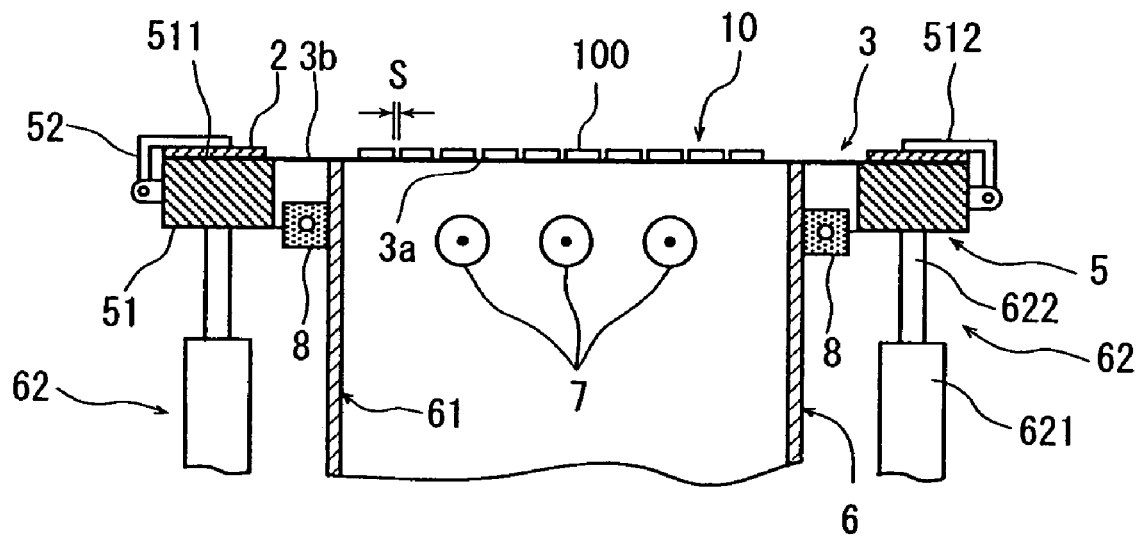

In the wafer dividing method in the illustrated embodiment, a step of shrinking the area existing between the inner periphery of the annular frame 2 and the semiconductor wafer 10 of the support tape 3 mounted on the annular frame 2 by heating comes after the chip spacing maintaining step. In this tape shrinking step, the infrared heater 8 is turned on in a state where the above-described chip spacing maintaining step has been carried out, as shown in FIG. 12(a) As a result, the area 3b existing between the inner periphery of the annular frame 2 and the semiconductor wafer 10 of the support tape 3 is heated by infrared radiation applied by the infrared heater 8, and shrunk. In line with this shrinking function, the annular frame holding member 51 is moved up to the standard position shown in FIG. 12(b) by activating the plurality of air cylinder 621 as the support means 62 constituting the tension application means 6. The temperature for heating the support tape 3 by the above infrared heater 8 is suitably 70 to 100° C. and the heating time is 5 to 10 seconds. A slack in the support tape 3 expanded in the above tape expanding step is removed by shrinking the area 3b existing between the inner periphery of the annular frame 2 and the semiconductor wafer 10 of the support tape 3. Therefore, the semiconductor wafer 10, which is supported to the annular frame 2 through the support tape 3, has undergone the tape shrinking step and the chip spacing maintaining step and has been divided into individual semiconductor chips 100, can be stored in a cassette.

A description will be subsequently given of another embodiment of the wafer dividing method of the present invention.

Figure 13:
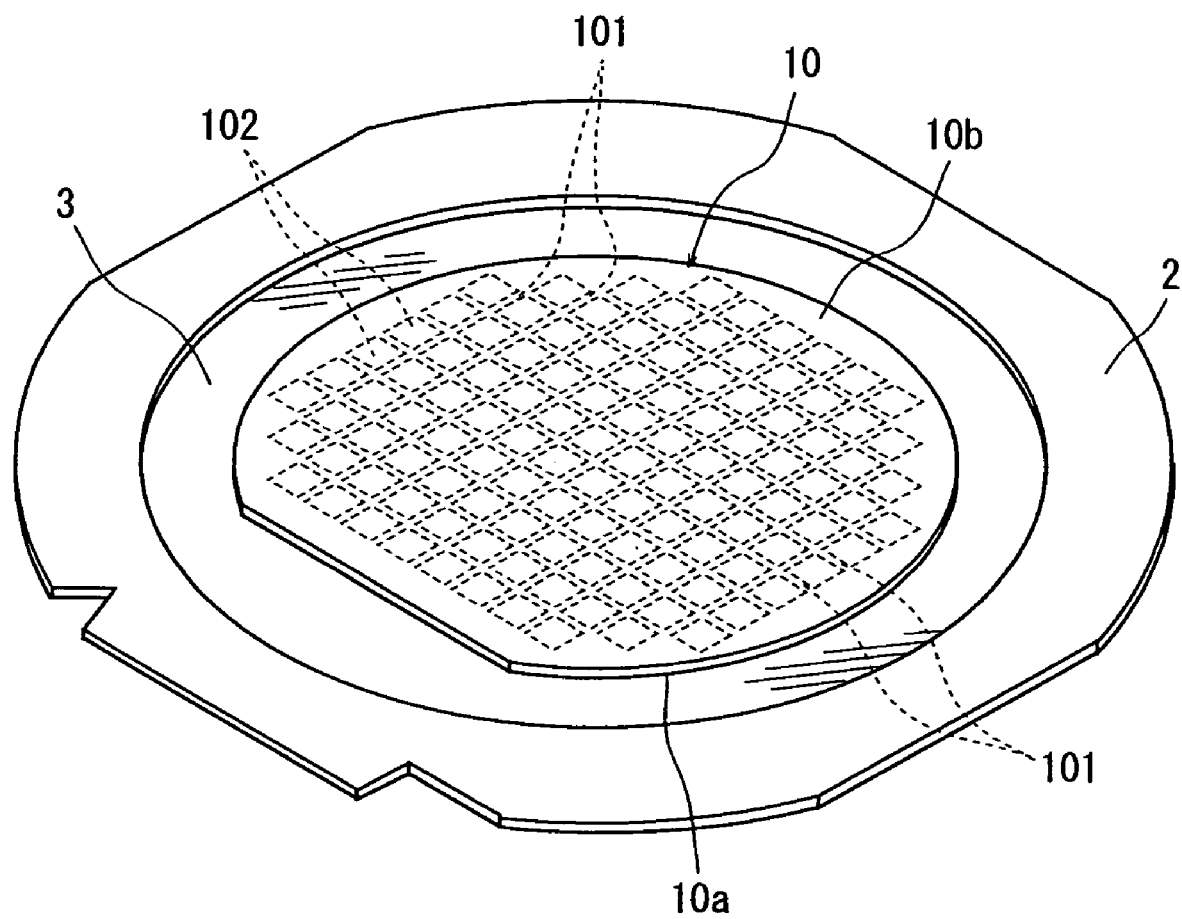
FIG. 13 is a perspective view of the semiconductor wafer put on the surface of the support tape mounted on the annular frame in another embodiment of the wafer dividing method of the present invention.

In this embodiment, a wafer supporting step of putting the wafer on the support tape having an adhesive layer that is mounted on the annular frame and cured by an external stimulus, is first carried out. That is, as shown in FIG. 13, the front surface 10a of the semiconductor wafer 10 is put on the surface of the support tape 3 mounted on the annular frame 2 (therefore, the back surface 10b of the semiconductor wafer 10 faces up). The annular frame 2 and the support tape 3 may be identical to the annular frame 2 and the support tape 3 in the above embodiment shown in FIG. 7, respectively.

After the wafer supporting step, next comes the step of forming a deteriorated layer along the dividing lines 101 in the inside of the semiconductor wafer 10 by applying a pulse laser beam capable of passing through the semiconductor wafer 10, along the dividing lines 101. In this deteriorated layer forming step, by using the laser beam processing machine 1 shown in FIGS. 2 to 4, the support tape 3 side of the semiconductor wafer 1 is held on the chuck table 11 (therefore, the back surface 10b of the semiconductor wafer 10 faces up) and a laser beam is applied from the back surface 10b of the semiconductor wafer 10 along the dividing line 101 as described above to form the deteriorated layer in the inside of the semiconductor wafer 10 along the dividing lines 101.

After the deteriorated layer forming step, next comes a step of expanding the support tape 3 affixed to the semiconductor wafer 10 to divide the semiconductor wafer 10 into individual chips along the dividing lines 101 where the deteriorated layer has been formed and to form a space between adjacent chips. In this tape expanding step, the support tape 3 is expanded as shown in FIGS. 10(a) and 10(b) by using the tape expansion apparatus 4 shown in FIG. 8 and FIG. 9 to divide the semiconductor wafer 10 into individual chips 100 along the dividing lines 101 where the deteriorated layer has been formed and to form the space S between adjacent chips.

After the semiconductor wafer 10 is divided into individual chips 100 along the dividing lines 101 where the deteriorated layer has been formed and the space S is formed between adjacent chips by carrying out the above tape expanding step, next comes a chip spacing maintaining step for maintaining the space S between adjacent chips by applying ultraviolet radiation to the area 3a, to which the semiconductor wafer 10 is affixed, of the support tape 3 in a state where the space S is formed between adjacent chips as shown in FIG. 11, to cure the adhesive layer formed on the support tape 3. Then, a tape shrinking step for shrinking the area 3b existing between the inner periphery of the annular frame 2 and the semiconductor wafer 10 in the support tape 3 mounted on the annular frame 2 by heating is carried out, as shown in FIGS. 12(a) and 12(b).

As described above, the deteriorated layer forming step, tape expanding step, chip spacing maintaining step and tape shrinking step can be carried out while the wafer is supported to the annular frame through the support tape by first carrying out the step of putting the front surface of the semiconductor wafer on the surface of the support tape mounted on the annular frame.

What is claimed is:

1. A method of dividing a wafer having a plurality of dividing lines formed on the front surface in a lattice pattern and function elements formed in a plurality of areas sectioned by the plurality of dividing lines into individual chips, along the dividing lines, the method comprising:

a deteriorated layer forming step for applying a laser beam capable of passing through the wafer along the dividing lines to form a deteriorated layer along the dividing lines in the inside of the wafer;

a wafer supporting step for putting the wafer after the deteriorated layer forming step on a support tape having an adhesive layer, which is mounted on an annular frame and is cured by an external stimulus;

a tape expanding step for expanding the support tape affixed to the wafer to divide the wafer into individual chips along the dividing lines where the deteriorated layer has been formed and to form a space between adjacent chips; and a chip spacing maintaining step for giving an external stimulus to an area, to which the wafer of the support tape is affixed, in a state where the space is formed between adjacent chips in the tape expanding step, to cure the adhesive layer and to maintain the space between adjacent chips.

2. The wafer dividing method according to claim 1, wherein the support tape is formed from a synthetic resin sheet which shrinks by heat at a temperature higher than a predetermined temperature, and a tape shrinking step for shrinking an area existing between the inner periphery of the annular frame and the wafer of the support tape mounted on the annular frame by heating is carried out after the chip spacing maintaining step.

3. A method of dividing a wafer having a plurality of dividing lines formed on the front surface in a lattice pattern and function elements formed in a plurality of areas sectioned by the plurality of dividing lines into individual chips, along the dividing lines, the method comprising:

a wafer supporting step for putting the wafer on a support tape having an adhesive layer that is mounted on an annular frame and is cured by an external stimulus;

a deteriorated layer forming step for applying a laser beam capable of passing through the wafer put on the support tape mounted on the annular frame, along the dividing lines to form a deteriorated layer along the dividing lines in the inside of the wafer;

a tape expanding step for expanding the support tape affixed to the wafer to divide the wafer into individual chips along the dividing lines where the deteriorated layer has been formed and to form a space between adjacent chips; and a chip spacing maintaining step for giving an external stimulus to the wafer, to which the wafer of the support tape is affixed, in a state where the space is formed between adjacent chips in the tape expanding step, to cure the adhesive layer to maintain the space between adjacent chips.

4. The wafer dividing method according to claim 3, wherein the support tape is composed of a synthetic resin sheet which shrinks by heat at a temperature higher than a predetermined temperature, and a tape shrinking step for shrinking the area existing between the inner periphery of the annular frame and the wafer of the support tape mounted on the annular frame by heating is carried out after the chip spacing maintaining step.

* * * * *